United States Patent
Perzlmaier et al.

(10) Patent No.: US 11,955,588 B2
(45) Date of Patent: Apr. 9, 2024

(54) OPTOELECTRONIC SEMICONDUCTOR COMPONENT AND METHOD FOR PRODUCING AN OPTOELECTRONIC SEMICONDUCTOR COMPONENT

(71) Applicant: OSRAM Opto Semiconductors GmbH, Regensburg (DE)

(72) Inventors: Korbinian Perzlmaier, Regensburg (DE); Kerstin Neveling, Pentling (DE); Heribert Zull, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 549 days.

(21) Appl. No.: 17/298,879

(22) PCT Filed: Nov. 18, 2019

(86) PCT No.: PCT/EP2019/081627
§ 371 (c)(1),
(2) Date: Jun. 1, 2021

(87) PCT Pub. No.: WO2020/114759
PCT Pub. Date: Jun. 11, 2020

(65) Prior Publication Data
US 2022/0069183 A1 Mar. 3, 2022

(30) Foreign Application Priority Data
Dec. 7, 2018 (DE) .......................... 102018131404.3

(51) Int. Cl.
*H01L 33/62* (2010.01)
*H01L 33/00* (2010.01)

(52) U.S. Cl.
CPC ............ *H01L 33/62* (2013.01); *H01L 33/005* (2013.01); *H01L 2933/0066* (2013.01)

(58) Field of Classification Search
CPC .................. H01L 33/62; H01L 33/005; H01L 2933/0066
(Continued)

(56) References Cited

U.S. PATENT DOCUMENTS

| 6,278,136 B1 | 8/2001 | Nitta |
| 2002/0117681 A1 | 8/2002 | Weeks et al. |

(Continued)

FOREIGN PATENT DOCUMENTS

| DE | 102007022947 A1 | 10/2008 |
| DE | 102008038852 A1 | 12/2009 |

(Continued)

OTHER PUBLICATIONS

International Search Report (with English translation) and Written Opinion dated Jan. 31, 2020 for corresponding International Application No. PCT/EP2019/081627 (Examiner, Unknown), 13 pages.

*Primary Examiner* — Igwe U Anya
(74) *Attorney, Agent, or Firm* — MH2 TECHNOLOGY LAW GROUP LLP

(57) ABSTRACT

In one embodiment, the optoelectronic semiconductor device comprises a semiconductor layer sequence and an electrical via. The semiconductor layer sequence includes an active zone for generating radiation and a contact layer for electrical contacting. The active zone lies in a plane perpendicular to a main growth direction of the semiconductor layer sequence and is located between a first semiconductor region and a second semiconductor region. The contact layer is located within the second semiconductor region. The via extends through the contact layer and preferably ends within the second semiconductor region. A contact surface between the via and the contact layer encloses a contact angle of at least 20° and at most 60° with respect to the plane.

17 Claims, 8 Drawing Sheets

(58) Field of Classification Search
USPC .......................................................... 257/79
See application file for complete search history.

(56) References Cited

U.S. PATENT DOCUMENTS

| | | |
|---|---|---|
| 2010/0171135 A1 | 7/2010 | Engl et al. |
| 2012/0086043 A1* | 4/2012 | Cho ..................... H01L 33/382 |
| | | 257/E33.064 |
| 2016/0155901 A1* | 6/2016 | Lopez ................... H01L 33/405 |
| | | 257/13 |
| 2018/0212107 A1 | 7/2018 | Kreuter et al. |

FOREIGN PATENT DOCUMENTS

| | | |
|---|---|---|
| DE | 102015111046 A1 | 1/2017 |
| EP | 2439794 A2 | 4/2012 |
| WO | 2015008184 A1 | 1/2015 |

* cited by examiner

OPTOELECTRONIC SEMICONDUCTOR COMPONENT AND METHOD FOR PRODUCING AN OPTOELECTRONIC SEMICONDUCTOR COMPONENT

CROSS-REFERENCE TO RELATED APPLICATIONS

This patent application is a national stage entry from International Application No. PCT/EP2019/081627, filed on Nov. 18, 2019, published as International Publication No. WO 2020/114759 A1 on Jun. 11, 2020, and claims priority under 35 U.S.C. § 119 from German patent application 10 2018 131 404.3, filed Dec. 7, 2018, the entire contents of all of which are incorporated by reference herein.

FIELD

An optoelectronic semiconductor device is specified. In addition, a method for producing optoelectronic semiconductor devices is specified.

BACKGROUND

The document DE 10 2015 111 046 A1 relates to an optoelectronic semiconductor chip with vias through an active zone. The vias comprise inclined edges in a semiconductor contact layer.

An object to be solved is to specify an optoelectronic semiconductor device that is efficiently electrically contactable.

This object is solved inter alia by an optoelectronic semiconductor device and by a method with the features of the independent patent claims. Preferred further developments are the subject of the remaining claims.

SUMMARY

According to at least one embodiment, the optoelectronic semiconductor device comprises a semiconductor layer sequence. The semiconductor layer sequence includes an active zone for generating radiation. The active zone comprises, for example, a multiple quantum well structure, a single quantum well structure, and/or a pn junction.

The semiconductor layer sequence is preferably based on a III-V compound semiconductor material. The semiconductor material is, for example, a nitride compound semiconductor material such as $Al_nIn_{1-n-m}Ga_mN$, abbreviated AlInGaN, or a phosphide compound semiconductor material such as $Al_nIn_{1-n-m}Ga_mP$, abbreviated AlInGaP, or also an arsenide compound semiconductor material such as $Al_nIn_{1-n-m}Ga_mAs$, abbreviated AlInGaAs, or such as $Al_nGa_mIn_{1-n-m}As_kP_{1-k}$, abbreviated AlGaInAsP, wherein in each case $0 \leq n \leq 1$, $0 \leq m \leq 1$ and $n+m \leq 1$ as well as $0 \leq k < 1$. For example, $0 < n \leq 0.8$, $0.4 \leq m < 1$ and $n+m \leq 0.95$ as well as $0 < k \leq 0.5$ apply to at least one layer or to all layers of the semiconductor layer sequence. In this context, the semiconductor layer sequence may comprise dopants as well as additional components. For simplicity, however, only the essential constituents of the crystal lattice of the semiconductor layer sequence, i.e. Al, As, Ga, In, N or P, are specified, even if these may be partially replaced and/or supplemented by small amounts of additional substances.

Preferably, the semiconductor layer sequence is based on the material system AlInGaP or on the material system AlGaInAsP. For example, the active zone is configured to generate yellow light, orange light or red light. A wavelength of maximum intensity of the radiation generated in the active zone during operation of the semiconductor device as intended is, for example, at least 560 nm or 570 nm or 580 nm and/or at most 650 nm or 620 nm.

According to at least one embodiment, the semiconductor device comprises one or more electrical vias. The at least one electrical via is preferably a metallic via. The via may be located directly on the semiconductor layer sequence in places. Alternatively, a thin intermediate layer can be located between the semiconductor layer sequence and the via at a contact region, for example made of a transparent conductive oxide, TCO for short, such as ITO or such as zinc oxide and/or with a thickness of at most 0.2 µm.

According to at least one embodiment, the semiconductor layer sequence comprises a contact layer. The contact layer is configured for electrical contacting of the semiconductor layer sequence. In particular, current is fed into the semiconductor layer sequence at least on an n-type side exclusively or predominantly via the contact layer. In other words, the contact layer is specifically configured so that current is fed into the semiconductor layer sequence via the contact layer.

According to at least one embodiment, the active zone lies in a plane perpendicular to a main growth direction of the semiconductor layer sequence. With other words, this plane is defined by the active zone. If the active zone comprises a comparatively large thickness, the plane along the main growth direction of the semiconductor layer sequence preferably lies centrally in the active zone.

According to at least one embodiment, the active zone is located between a first semiconductor region with a first conductivity type and a second semiconductor region with a second conductivity type. The first conductivity type is different from the second conductivity type. In particular, the first conductivity type is p and the second conductivity type is n.

According to at least one embodiment, the contact layer is located within the second semiconductor region. This means that the contact layer is not located at edges of the second semiconductor region, seen along the main growth direction, but that the contact layer is adjacent to further layers of the second semiconductor region on both sides. In particular, a current spreading layer directly adjoins a side of the contact layer facing away from the active zone, alternatively a side of the contact layer facing the active zone.

According to at least one embodiment, the via extends through the first semiconductor region, through the active zone, and through the contact layer. The via extends into a portion of the second semiconductor region located on a side of the contact layer facing away from the active zone. The via terminates within the second semiconductor region. Thus, the via penetrates the second semiconductor region only incompletely.

According to at least one embodiment, an electrical contact region is located at a boundary region between the via and the contact layer. The contact region is configured for current feeding into the semiconductor layer sequence. Preferably, the contact region is a boundary of the contact layer to the via and/or to the interlayer.

According to at least one embodiment, the contact region includes a contact angle to the plane defined by the active zone. The contact angle is at least 20° or 30° in places or, preferably, over the entire surface. Alternatively or additionally, the contact angle is at most 75° or 70° or 60° or 50° or 40°.

In at least one embodiment, the optoelectronic semiconductor device comprises a semiconductor layer sequence and at least one electrical via. The semiconductor layer sequence includes an active zone for generating radiation and a contact layer for electrically contacting the semiconductor layer sequence. The active zone lies in a plane perpendicular to a main growth direction of the semiconductor layer sequence and is located between a first semiconductor region with a first conductivity type and a second semiconductor region with a second conductivity type different from the first one. The contact layer is located within the second semiconductor region. The via extends through the contact layer, preferably also through the first semiconductor region and through the active zone, and preferably terminates within the second semiconductor region. A contact region between the via and the contact layer includes a contact angle to the plane of at least 20° and of at most 75°, preferably of at most 60°. In particular, the contact region is an electrical contact region directly between the via and the contact layer.

With the via, electrical contacting of buried layers in the epitaxially grown semiconductor layer sequence is achievable. To avoid and reduce optical absorption, the layer to be contacted, i.e. the contact layer, should preferably be as thin as possible. This applies in particular to semiconductor layer sequences made of the InGaAlP material system.

In conventional semiconductor devices, it must be possible to reliably expose the contact layer by plasma etching processes, for example, and then make contact. In the case of LED chips based on the InGaN material system, there is usually a comparatively thick contact layer, wherein a via stops within this relatively thick contact layer.

Alternatively, especially in the case of InGaN-based LEDs without a growth substrate, there is no buried contact layer, but a contact layer is located on a back side of the LED and is exposed over the surface and electrically contacted by a removal of a growth substrate and, if necessary, by a defined etching process.

In the semiconductor device described here, the contact layer is not exposed over a large area by an etching process, but is etched through in a targeted manner. In this process, a flat contact angle is generated so that an annular area of the contact layer, for example, is exposed at one edge of the etching area for electrical contacting. The area available for contacting is thus proportional, for example, to the tangent of the deviation of the contact angle from a perpendicular direction, in particular to the main growth direction, and is also dependent on a thickness of the contact layer and a circumference of the etched area.

Thus, comparatively thin contact layers can be used for electrical contacting, so that optical losses at the contact layer can be reduced or avoided. Due to the design of the vias, the thin contact layer can be processed across a wafer with a greater manufacturing tolerance.

Etching of the contact layer can be performed over the entire via. Alternatively, similar to a conventional etch process, etching can be performed close to the layer to be contacted and subsequently the remaining etch through the contact layer is performed in parallel at many small locations to maximize the available contact region. This is preferably done if a lateral current spreading in the semiconductor layer sequence is not performed by the contact layer itself, but is ensured via a current spreading layer, for example below the contact layer.

According to at least one embodiment, the via contacts the semiconductor layer sequence outside the contact region in an interface. In other words, the interface comprises all regions of the via outside the contact region that are adjacent to the second semiconductor region. During operation of the semiconductor device, only a subordinate current feeding occurs at the interface. A main current feeding in the semiconductor layer sequence thus takes place at the contact region. A current feeding per unit area at the interface is preferably lower than at the contact region by at least a factor of 10 or 30 or 100. In particular, a current feeding at the interface is negligible compared to a current feeding at the contact region.

According to at least one embodiment, the via is surrounded all around by a material of the semiconductor layer sequence as seen in plan view. That is, the semiconductor layer sequence can extend closed all around the via. Alternatively, it is possible that the via is located at an edge of the semiconductor layer sequence, so that the via is not surrounded by the semiconductor layer sequence on at least one side, as seen in plan view.

According to at least one embodiment, the via pierces the contact layer by at most twice or three times or four times a thickness of the contact layer. Alternatively or additionally, the via pierces the contact layer by at least 0.1 µm or 0.2 µm and/or by at most 0.5 µm or 1 µm or 2 µm. In other words, the via extends only comparatively slightly beyond the contact layer into the second semiconductor region.

According to at least one embodiment, the contact layer is comparatively thin. In particular, this means that a thickness of the contact layer is at least 20 nm or 40 nm or 60 nm. Alternatively or additionally, this thickness is at most 200 nm or 150 nm or 100 nm or 80 nm.

According to at least one embodiment, the contact layer comprises a higher doping and/or a higher electrical conductivity compared to adjacent layers than the surrounding material. The doping and/or the conductivity are, for example, at least a factor of 2 or 5 or 10 above the conductivity and/or doping of the adjacent semiconductor material.

Alternatively, it is possible that the contact layer comprises a different dopant than the surrounding material. Further, the contact layer may comprise a different material composition than the surrounding semiconductor material, for example, in the case of InGaAlP, a variation in the ratio of In to Ga to Al relative to the adjacent semiconductor material.

For example, the contact layer is made of AlGaInP, preferably doped with Te and/or with Si. For example, a doping concentration is at least $5\times10^{18}$ pro $cm^3$ or at least $1\times10^{19}$ per $cm^3$.

According to at least one embodiment, the via is strip-shaped or L-shaped or U-shaped or T-shaped or frame-shaped when viewed from above on the plane defined by the active zone. Thus, an aspect ratio of a longitudinal extension and an average width of the via is relatively high. This aspect ratio is, for example, at least 5 or 10 or 20.

Seen in plan view, the longitudinal extension preferably follows a course of the via. For example, in the case of an L-shaped via, the longitudinal extension comprises a kink so that the L-shape is followed, and in the case of a frame-shaped via, the longitudinal extension forms a closed line.

According to at least one embodiment, a quotient of an average width of the via and of a thickness of the contact layer is at least 2 or 3 or 5. Alternatively or additionally, this quotient is at most 100 or 25 or 15 or 10. Relative to the thickness of the contact layer, the via is thus comparatively narrow.

According to at least one embodiment, the average width of the via is at least 0.1 µm or 0.2 µm or 0.3 µm. Alternatively or additionally, the average width is at most 5 µm or 1.5 µm or 1 µm or 0.5 µm.

According to at least one embodiment, the contact region is partially or entirely configured as part of a cone shell. Seen in cross-section, the contact region may be shaped as a symmetrical trapezoid. It is possible that the contact region comprises a plurality of partial surfaces, each of which may be shaped as part of a cone shell.

According to at least one embodiment, the contact region comprises a plurality of annular or circular ring shaped parts when viewed in plan. These parts of the contact region may be arranged concentrically. It is possible that the contact region, as seen in plan view, consists of such partial surfaces.

According to at least one embodiment, the contact layer is pierced by the via a plurality of times. If several of the vias are present, the contact layer may be pierced multiple times by each of the vias. In particular, this means that a base surface of the respective via has a relief-like design and comprises depressions and elevations, so that the contact layer can be perforated multiple times in the region of the via.

According to at least one embodiment, the contact region comprises a plurality of juxtaposed parts or partial surfaces as viewed in plan. These juxtaposed parts or partial surfaces are, for example, annular and/or island-shaped. Annular means that the contact region includes a surface that is not intended for electrical contacting. Island-shaped means that the parts or partial areas in question are closed and contiguous and without gaps. Such areas may be circular or irregular in shape.

According to at least one embodiment, the adjacent parts or partial areas of the contact region are regularly arranged. Such a structure can be achieved, for example, by a lithographic method.

According to at least one embodiment, the juxtaposed parts or partial surfaces of the contact region are irregularly arranged. For example, the contact region is then formed by a roughening that completely penetrates the contact layer in places.

Mixed forms may also be present, such that the contact region comprises both regularly arranged partial surfaces and irregularly arranged partial surfaces.

According to at least one embodiment, the via is guided through the first semiconductor region and through the active zone with a flank angle. The flank angle is larger than the contact angle and is preferably selected to be close to 90°, so that side surfaces of the via can extend approximately perpendicular to the plane in this region. In particular, the flank angle to the plane is at least 70° or 80° or 85° or 88°, preferably at least 80°. This means, in particular, that the comparatively small contact angle is present exclusively in the region of the contact layer and that otherwise the vias comprise side surfaces extending approximately parallel to the main growth direction.

According to at least one embodiment, the flank angle is larger than the contact angle by at least 10° or 20° or 40°.

That is, the flank angle is preferably significantly greater than the contact angle.

According to at least one embodiment, a gap is located between the side surfaces of the via and the semiconductor layer sequence in places or over the entire surface. The gap may be evacuated or gas-filled. Alternatively to a gap, an electrically insulating layer is located on the side surfaces, wherein preferably no gaps are present between the insulating layer and the via as well as between the insulating layer and the semiconductor layer sequence.

According to at least one embodiment, the contact layer extends over the entire second semiconductor region, with the exception of the via, and again forms a continuous, closed layer, with the exception of the via. In other words, the contact layer is penetrated solely by the at least one via and is otherwise an uninterrupted, continuous and contiguous layer.

According to at least one embodiment, a thickness of the second semiconductor region on a side of the contact layer opposite to the active zone is continuously or predominantly at least five times or ten times a thickness of the contact layer. In other words, the second semiconductor region is continuously comparatively thick at the side of the contact layer facing away from the active zone.

According to at least one embodiment, the second semiconductor region on the side facing away from the active zone is configured for lateral current distribution. With other words, the second semiconductor region in this region may be a current spreading layer.

According to at least one embodiment, the semiconductor device comprises exactly one via or exactly two vias. Thereby, the contact angle is preferably between 20° and 35° inclusive and the first semiconductor region is p-doped and the second semiconductor region is n-doped.

According to at least one embodiment, a quotient of the contact region and of an area of the via is at most 10 or 6. Alternatively or additionally, this quotient is at least 0.8 or 1 or 1.5. That is, the contact region may be larger than the area of the via. The area of the via is, for example, a cross-sectional area of the via at the level of the active zone or at the level of the contact layer, wherein this cross-sectional area is oriented parallel to the plane defined by the active zone.

According to at least one embodiment, an area of the active zone is larger than the contact region. For example, the active zone is at least 20 times or 50 times or 100 times or 300 times larger than the contact region. Thus, only a comparatively small portion of the active zone is removed via the vias, allowing efficient light generation in the semiconductor layer sequence.

Furthermore, a method for producing optoelectronic semiconductor devices is specified. The method is preferably used to produce a semiconductor device as described in connection with one or more of the above embodiments. Features of the method are therefore also disclosed for the semiconductor device, and vice versa.

In at least one embodiment, the method comprises the following steps, preferably in the order indicated:
A) providing a growth substrate for the semiconductor layer sequences,
B) growing the semiconductor layer sequence on the growth substrate so that the second semiconductor region is located closer to the growth substrate than the first semiconductor region,
C) forming at least one recess for the at least one via through the contact layer, and
D) forming the metallic via such that the via preferably overhangs or is flush with the first semiconductor region in a direction away from the contact layer.

The growth substrate may be subsequently removed. It is possible that a permanent replacement substrate is attached prior to removing the growth substrate. Alternatively, the semiconductor devices are so-called substrate-less thin film chips, which are free of a growth substrate and free of a replacement carrier.

Mechanical stabilization of the semiconductor device is then achieved via the semiconductor layer sequence on the one hand and on the other hand by the via and electrical contacts, which can be manufactured comparatively thickly by electroplating, for example. Furthermore, it is possible that the via and/or electrical contacts are embedded in a potting material, for example made of a plastic, and that further mechanical stabilization can be achieved via such a potting material.

BRIEF DESCRIPTION OF THE DRAWINGS

In the following, an optoelectronic semiconductor device described herein and a method described herein are explained in more detail with reference to the drawing by means of exemplary embodiments. Like reference signs specify like elements in the individual figures. However, no scale references are shown; rather, individual elements may be shown exaggeratedly large for better understanding.

In the Figures.

DETAILED DESCRIPTION

Figure 1:
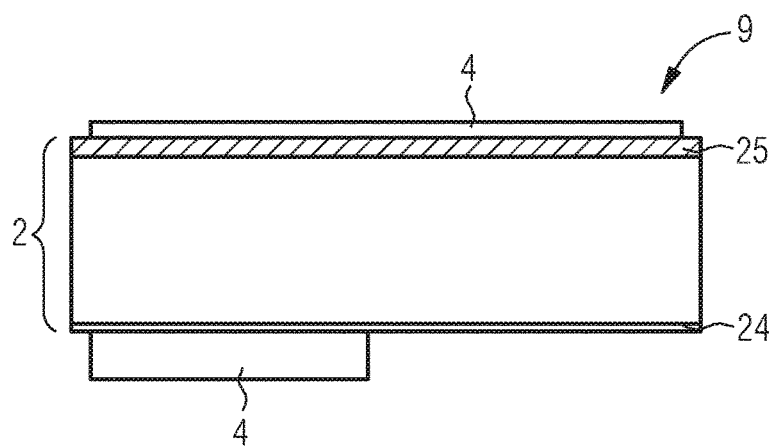
FIGS. 1 and 2 show schematic sectional views of variations of semiconductor devices.

FIG. 1 illustrates a modification 9 of a semiconductor device. The modification 9 comprises a semiconductor layer sequence 2. The semiconductor layer sequence 2 is delimited on both sides by a contact layer 25 and by a further contact layer 24 for electrical contacting of the semiconductor layer sequence 2. A metallic and planar electrical contact 4 is located at the contact layer 25. The further contact layer 24 is covered in areas by the further electrical contact 4.

The contact layer 25 is exposed, for example, when a growth substrate not shown for the semiconductor layer sequence 2 is removed. In this process, an etching process may be required to remove any seed layers or buffer layers from the contact layer 25. However, such removal of a growth substrate may damage the contact layer 25 in places, particularly in the case of growth substrates with a comparatively large diameter.

Figure 2:
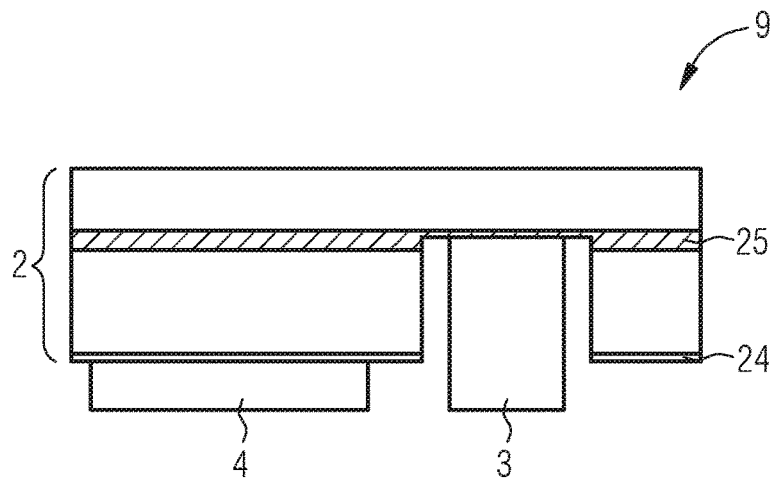

According to the modification 9 in FIG. 2, the contact layer 25 is located within the semiconductor layer sequence 2. An electrical contact is made only from one side of the semiconductor layer sequence 2. In addition to the further electrical contact 4, a via 3 is present. The electrical via 3 ends within the contact layer 25. Thus, an etching of a recess for the via 3 can be precisely adjusted to accurately hit the contact layer 25 over an entire wafer.

In addition, such a contact layer 25, as shown in FIG. 2, must be chosen to be relatively thick so that the via 3 can actually terminate within the contact layer 25, across the entire wafer. This leads to increased optical losses in the contact layer 25, which is usually highly doped and thus comparably strongly light absorbing.

Figure 3:
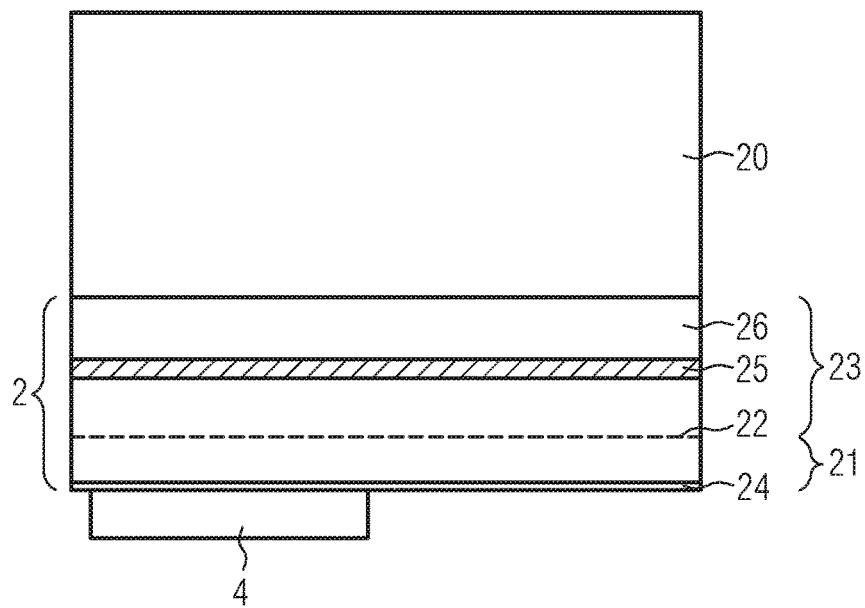
FIGS. 3 to 5 show schematic sectional views of method steps of a method described herein for the production of optoelectronic semiconductor devices.
Figure 4:
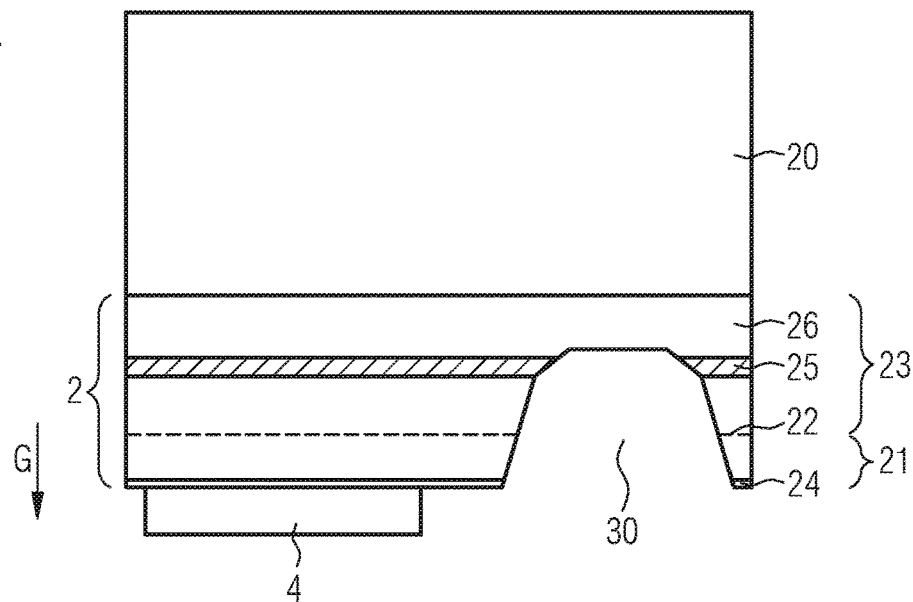
Figure 5:
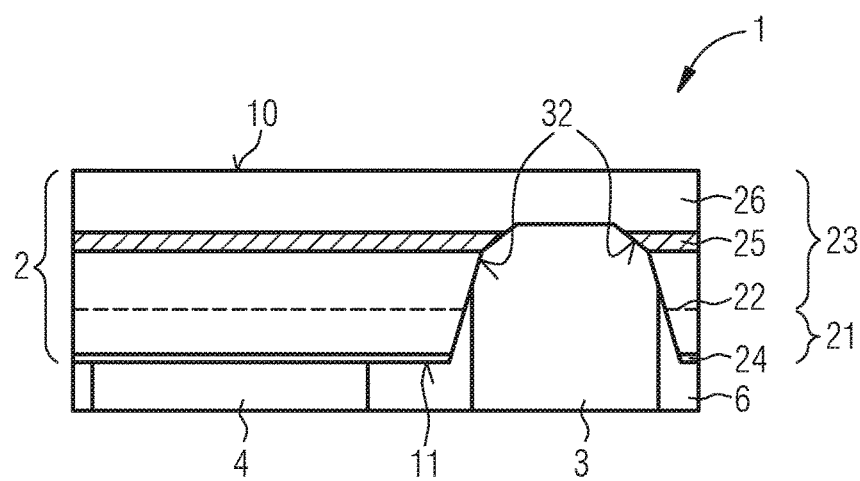

FIGS. 3 to 5 show a production process for an exemplary embodiment of an optoelectronic semiconductor device 1.

Referring to FIG. 3, the semiconductor layer sequence 2 is grown on a growth substrate 20. The growth substrate 20 is, for example, a GaAs substrate. A main growth direction G for the semiconductor layer sequence 2 is oriented perpendicular to the growth substrate 20.

The semiconductor layer sequence 2 includes the contact layer 25, which is located within a second semiconductor region 23. The second semiconductor region 23 is preferably n-doped and optionally comprises a current spreading layer 26 in the vicinity of the growth substrate 20. Towards a first semiconductor region 21, which is preferably p-doped, there is an active zone 22. On a side facing away from the active zone 22, the first semiconductor region 21 comprises a further contact layer 24.

The second semiconductor region 23 is based, for example, on InAlP with a Te-doping of about $1 \times 10^{17}$ per $cm^3$. The current spreading layer 26 is preferably made of InAlP with a Te doping of about $1 \times 10^{18}$ per $cm^3$. The contact layer 25 is in particular an InAlGaP layer, such as In(Al0.5Ga0.5)P, with a Te doping of about $1 \times 10^{19}$ per $cm^3$.

Optionally, the further electrical contact 4 can already be generated at the further contact layer 24 in this method step. The further electrical contact 4 is preferably metallic and can be composed of several metallic layers. Deviating from the illustration of FIGS. 3 to 5, the further electrical contact 4 can also be generated only in a later method step. It is possible that a TCO layer is located directly on the semiconductor layer sequence, not drawn.

In the method step of FIG. 4 it is illustrated that a recess 30 is etched into the semiconductor layer sequence 20. The recess 30 extends completely through the first semiconductor region 21, through the active zone 22 and also through the contact layer 25. The recess 30 terminates within the current spreading layer 26.

The recess 30 is formed with two different flank angles. Through the first semiconductor region 21 and through the active zone 22, side faces of the recess 30 are oriented nearly parallel to the main growth direction G. Only in the area of the contact layer 25 flat side surfaces and thus with a relatively small contact angle are generated in order to ensure a relatively large interface to the contact layer 25. This is explained in more detail in connection with FIG. 6.

Finally, it is shown in FIG. 5 that the electrical via 3 is created in the recess 30. The electrical via 3 is metallic. A contact region 32 is formed at a boundary of the via 3 to the contact layer 25. The contact region 32 has the shape of a part of a cone shell. An n-side current feeding in the semiconductor layer sequence 2 occurs predominantly or exclusively at the contact region 32.

The contact region 32 is configured, for example, for a current density of 0.1 mA per $\mu m^2$ to 5 mA per $\mu m^2$, as is also possible in all other exemplary embodiments.

A back side 11 with contacts 3, 4 is opposite to a radiation exit side 10. The radiation exit side 10 is preferably formed by the second semiconductor region 23. It is possible that a roughening is present at the radiation exit side 10 for better light extraction.

Optionally, as in all other exemplary embodiments, a potting body 6 may be generated. The potting body 6 is preferably made of a plastic. The contacts 3, 4 may be embedded in the potting body 6. Optionally, there may be undrawn passivation layers and/or mirror layers between the potting body 6 and the semiconductor layer sequence 2.

Furthermore, it is possible that the potting body 6 also partially or completely covers external side surfaces of the semiconductor layer sequence 2, unlike shown in FIG. 5.

Figure 6:
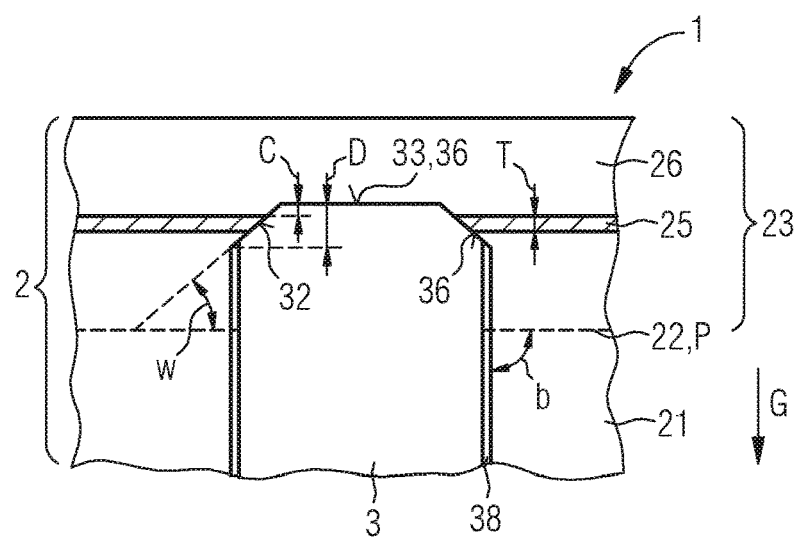
FIGS. 6 to 10 show schematic sectional views of exemplary embodiments of optoelectronic semiconductor devices described herein.

In FIG. 6 the via 3 in the area of the contact layer 25 is shown in more detail.

A plane P is defined by the active zone 22. The plane P is oriented perpendicular to the main growth direction G. The contact layer 25 runs parallel to the plane P and thus parallel to the active zone 22.

At the active zone 22 as well as in the region of the first semiconductor region 21, side surfaces of the via 3 are oriented approximately perpendicular to the plane P with a flank angle b. In this region, an electrical insulation layer 38 can be located between the via 3 and the semiconductor layer sequence 2.

A contact angle w is present at a base surface 33 of the via 3 in the region of the contact layer 25. The contact angle w is approximately 35° and is thus comparatively small relative to the flank angle b. Thus, the via 3 intersects the contact layer 25 at the comparatively small contact angle w. This creates a relatively large area at the contact layer 25 for the contact region 32.

The, for example, planar base surface 33 of the via 3 as well as regions of the via 3 outside the contact region 32, which adjoin the second semiconductor region 23, form an interface 36. Relative to the contact region 32, no or no significant current feeding into the semiconductor layer sequence 2 from the via 3 occurs in the interface 36.

The via 3 ends in the second semiconductor region 23 on a side of the contact layer 25 facing away from the active zone 22. In this case, a piercing length C of the via 3 beyond the contact layer 25 is comparatively small. The piercing length C is preferably at about a thickness T of the contact layer 25. Alternatively or additionally, the piercing length C is between 0.1 µm and 1 µm inclusive.

A tip length D of the via 3, in which the contact angle w is present, is preferably also in the order of magnitude of the thickness T of the contact layer 25. For example, the tip length D is at least twice or three times and/or at most five times or four times the thickness T. The same preferably applies to all other exemplary embodiments.

Figure 7:
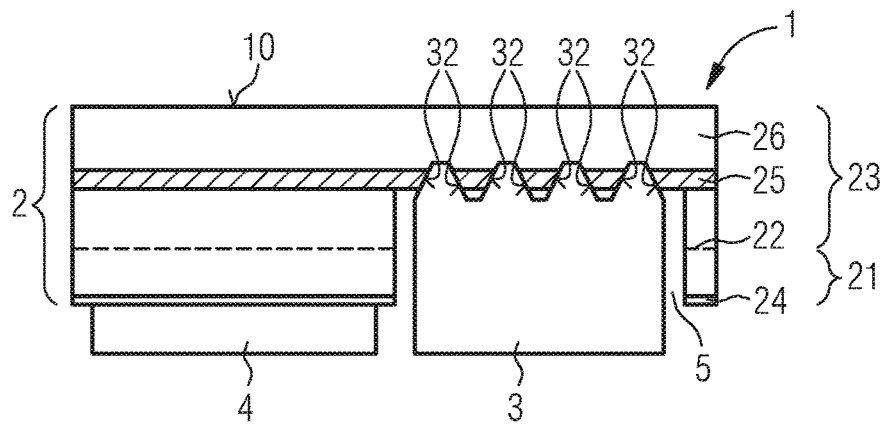

In the exemplary embodiment of FIG. 7, it is illustrated that the via 3 comprises many piercing areas through the contact layer 25. Thus, many contact regions 32 are formed, and a total size of the contact regions 32 taken together may be relatively large. The individual piercing regions of the via 3 through the contact layer 25 may be regularly arranged as viewed in cross section.

Optionally, a gap 5 is located between the via 3 and the semiconductor layer sequence 2 in the lateral direction. As an alternative to a gap 5, an electrically insulating material such as the insulation layer 38 of FIG. 6 or such as the potting body 6 of FIG. 5 may be present around the via 3. The same applies to all other exemplary embodiments.

Figure 8:
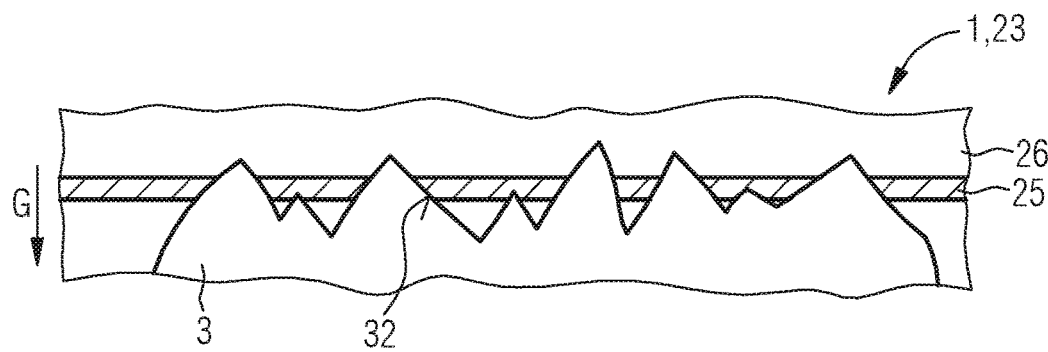

In FIG. 8, the area of the via 3 at the contact layer 25 is shown in more detail. According to FIG. 8, an irregular roughening is produced at the tip of the via 3. Thus, seen in cross-section, the via 3 penetrates the contact layer 25 in many piercing areas.

It is possible that all structures of the roughening penetrate the contact layer 25. Alternatively, as shown in FIG. 8, the contact layer 25 is only completely penetrated in places and optionally present further structures of the roughening extend only up to or into the contact layer 25. A large contact region 32 can be achieved by such roughening.

Figure 9:
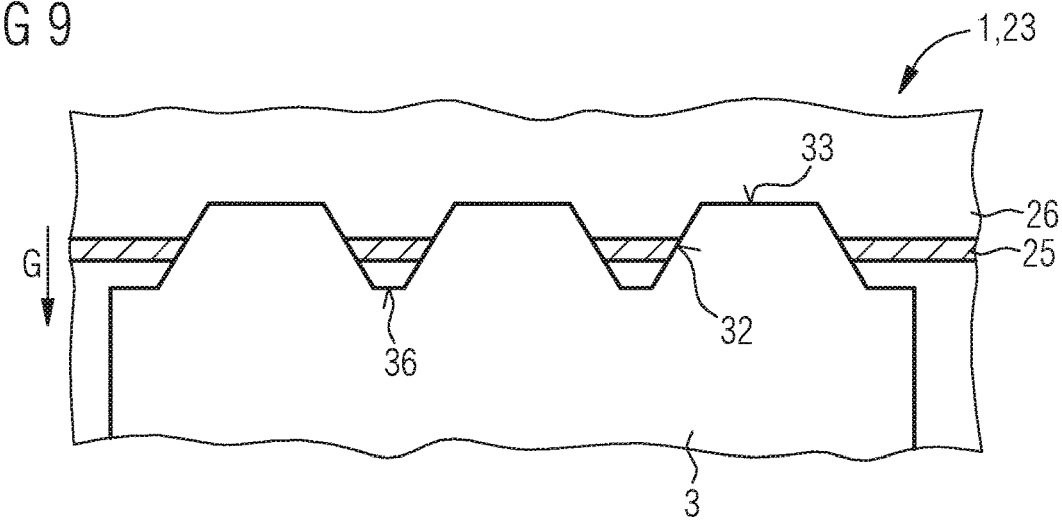

According to the exemplary embodiment of FIG. 9, the contact layer 25 is regularly penetrated several times by the via 3. The individual areas of the base surface 33 can run straight and perpendicular to the main growth direction G when viewed in cross-section. Between the obliquely extending partial sections of the contact region 32, there may be regions of the interface 36 on the via 3, each extending perpendicularly to the growth direction G. This may also apply to an outer edge around the piercing regions.

Figure 10:
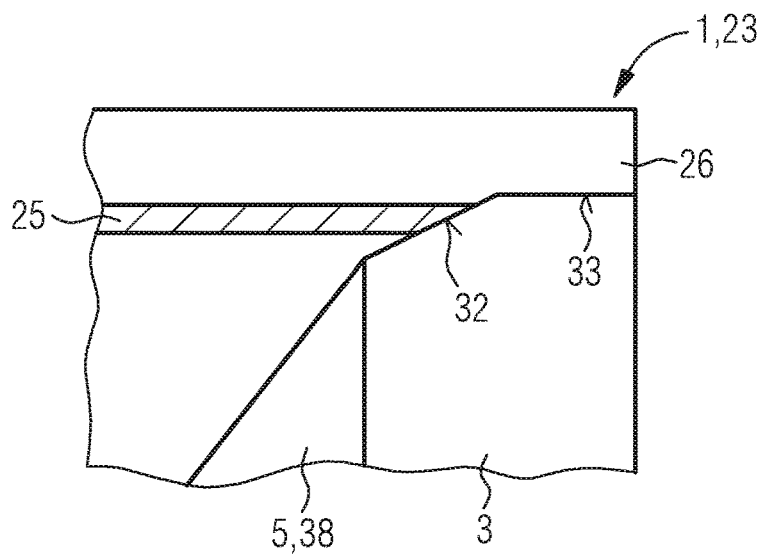

In FIG. 10, it is shown that the via 3 is not delimited on one side by the semiconductor layer sequence 2. Thus, the via 3 can be located at an edge of the semiconductor layer sequence 2. The same is possible in all other exemplary embodiments.

In FIGS. 11 to 16, various realization options of the via 3 and also of the further contact region 4 are shown in each case in a view onto the back side 11.

Figure 11:
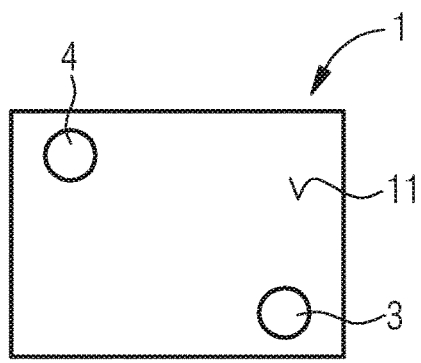
FIGS. 11 to 19 show schematic top views of exemplary embodiments of optoelectronic semiconductor devices described herein.

According to FIG. 11, the contact 4 and the via 3 are circular in shape when viewed from above. The contact 4 and the via 3 can be located in opposite corners of the semiconductor device 1.

Figure 12:
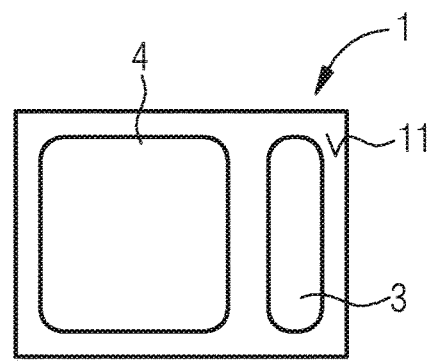

In FIG. 12, it is shown that the via 3 is strip-shaped when viewed from above and extends almost completely along a side edge of the semiconductor device 1. The approximately rectangular contact 4 may be areally formed.

Figure 13:
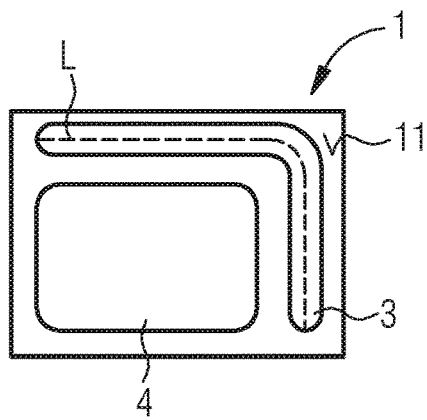

In FIG. 13, it is illustrated that the via 3 is L-shaped as seen in plan view and thus comprises a kinked, relatively large longitudinal extension L. The contact 4 can have a flat design.

A width of the via 3 in the direction perpendicular to the longitudinal extension L is, for example, approximately 0.5 µm. With an exemplary contact angle w of 35° and a thickness of the contact layer 25 of 100 nm, a larger contact region 32 results below an average width of approximately 0.5 µm than in the case of geometries as shown in variation 9 of FIG. 2.

Figure 14:
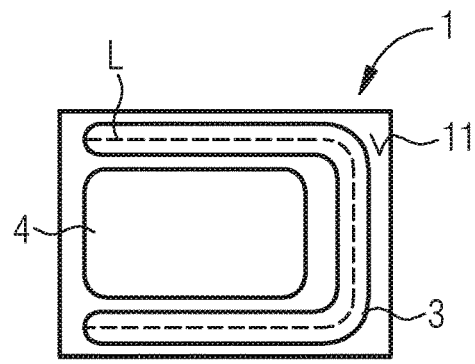

According to FIG. 14, the via 3 is U-shaped when viewed from above and surrounds the contact 4 on three sides.

Figure 15:
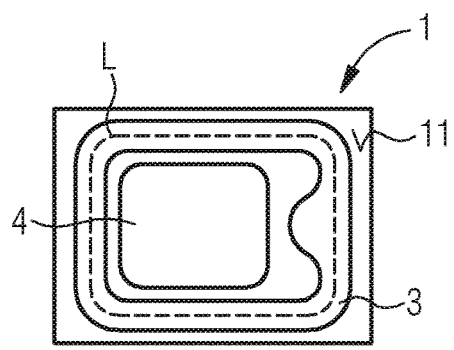

In the exemplary embodiment of FIG. 15, the via 3 forms a closed frame around the contact 4 as seen in plan view. The via 3 can comprise at least one widening, for example to enable electrical contacting, for example via a bonding wire. The widening can be created centrally on a long side or, in contrast to FIG. 15, can also be located in a corner region.

Figure 16:
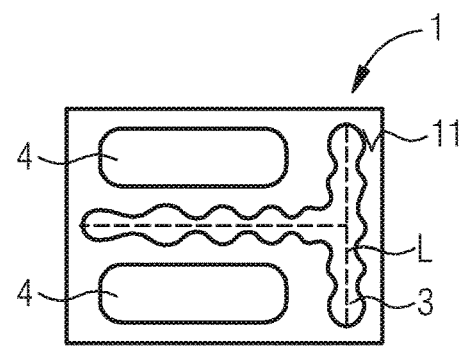

In the exemplary embodiment of FIG. 16, the via 3 is T-shaped. It is possible that the contact 4 is divided into two partial surfaces. Alternatively, one of these two partial surfaces of the contact 4 may be omitted.

In order to enlarge a circumferential line of the via 3 and thus to enlarge the contact region 32, an outline of the via 3 as seen in plan view can be provided with a structuring, for example in the form of a wave. Such a structured, in particular wavy, outline of the via 3 may also be present in all other exemplary embodiments, in particular in FIGS. 11 to 15.

The designs of the via 3 in plan view, as shown in FIGS. 11 to 16, can be used in each case for the exemplary embodiments of FIGS. 5 to 9. The same applies to FIG. 10, wherein the vias 3 are then each located on one edge of the back side 11.

Figure 17:
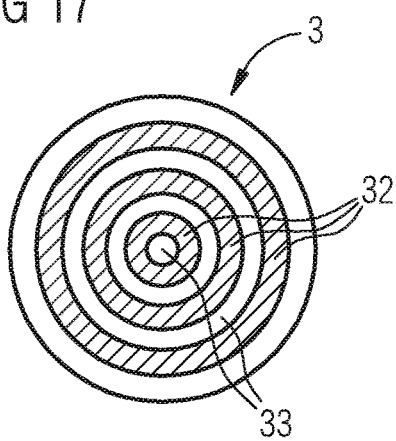
Figure 18:
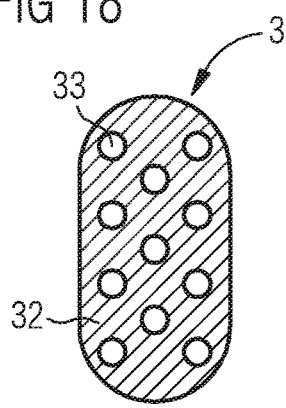
Figure 19:
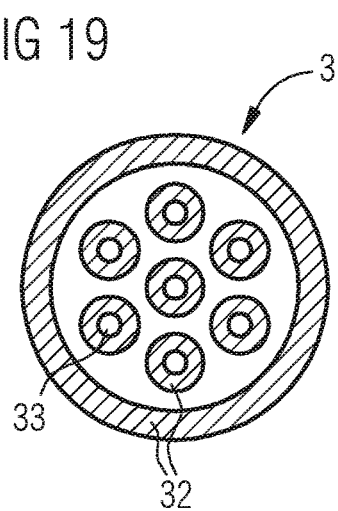

FIGS. 17 to 19 show exemplary designs of the vias 3 in the region of the base surface 33. Corresponding vias 3 can be used in all other exemplary embodiments. The geometries shown in FIGS. 17 to 19 can in each case be adapted accordingly to the shape of the vias 3 of FIGS. 11 to 16 as seen in plan view. Thus the design possibilities of FIGS. 17 to 19 are not limited to circular or oval geometries.

FIG. 17 illustrates a shape of the contact regions 32 resulting, for example, from vias 3 as illustrated in FIG. 9. Thus, there are several concentric contact regions 32 as seen in plan view. The rings forming the contact region 32 may be arranged equidistantly or may comprise varying distances from one another.

In FIG. 18, it is shown that the contact region 32 may be substantially continuous. In, for example, circular regions for the base surface 33, the current spreading layer of the second semiconductor region 23 may be exposed. These openings for the base surface 33 may be arranged in a regular pattern. In FIG. 19, it is illustrated that the contact region 32 comprises an outer circular ring. Within this outer circular ring, a plurality of rings of the contact region 32 are arranged, for example, in a regular pattern. Such a structure may result, for example, from the exemplary embodiment of FIG. 7.

Figure 20:
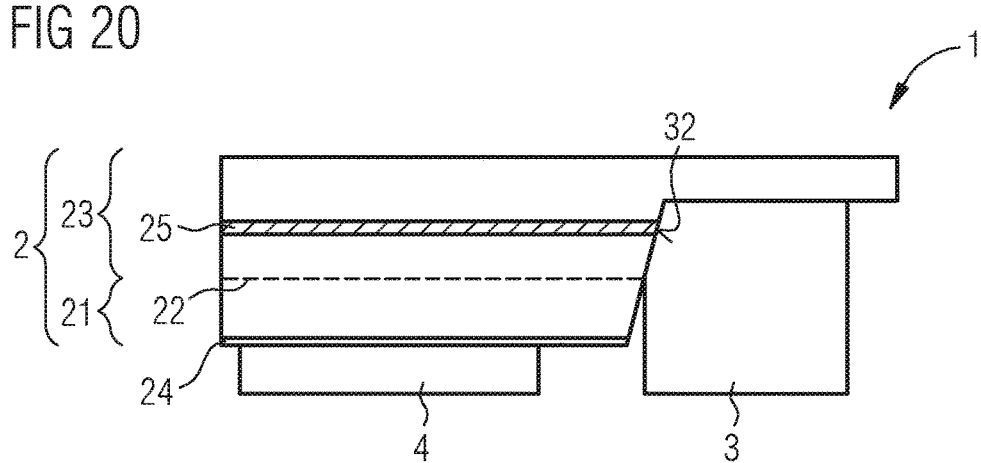
FIGS. 20 to 26 show schematic sectional views of exemplary embodiments of optoelectronic semiconductor devices described herein.

In the exemplary embodiment of FIG. 20, the via 3 is located only at one edge or at several edges of the active zone 22, so that the via at the level of the active zone 22 is not surrounded all around by a material of the semiconductor layer sequence 2. Unlike in FIG. 10, however, a part of the second semiconductor region 23 protrudes laterally over the via 3.

Figure 21:
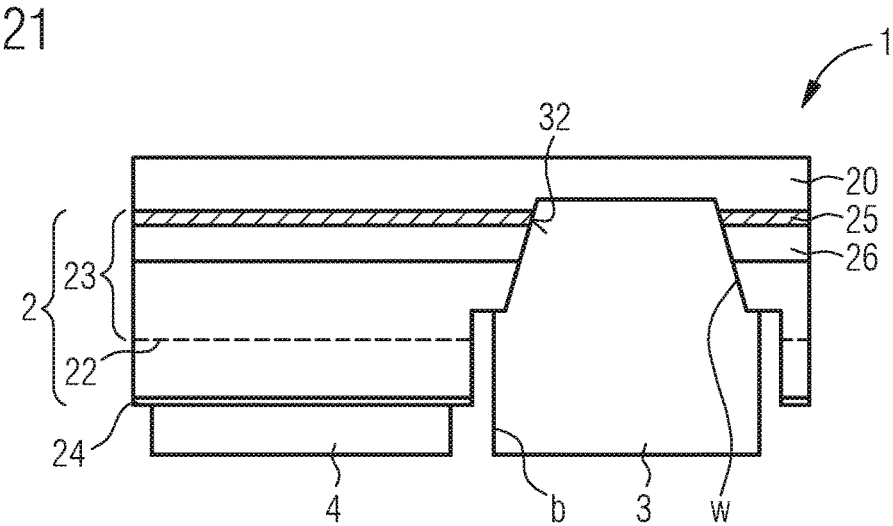

According to FIG. 21, the via 3 comprises a flank angle b of, for example, 90° in an outer region, and the contact angle w is present in an inner region, which is, for example, 40°. Between the inner and outer regions, the via 3 comprises a step with a plateau. In the region of the step, the via 3 can rest on the semiconductor layer sequence 2 in the direction parallel to the active zone 22. Such designs of the via 3 may also be present in all other exemplary embodiments.

Furthermore, it is illustrated in FIG. 21 that the growth substrate 20 is still present, optionally thinned. The current spreading layer 26 is located on a side of the contact layer 25 facing the active zone 22. The via 3 extends into the growth substrate 20 and ends within the growth substrate 20.

Figure 22:
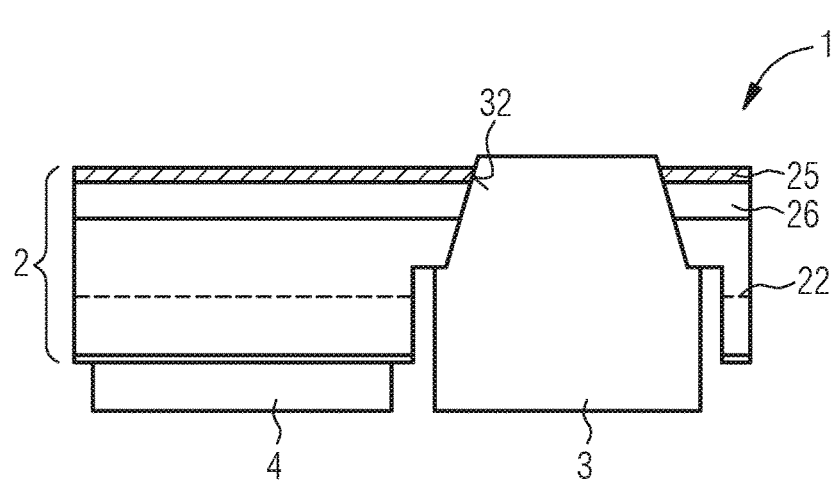

In FIG. 22, compared with FIG. 21, the growth substrate is no longer present. The via 3 thus protrudes over the contact layer 25 and ends outside the semiconductor layer sequence 2.

Figure 23:
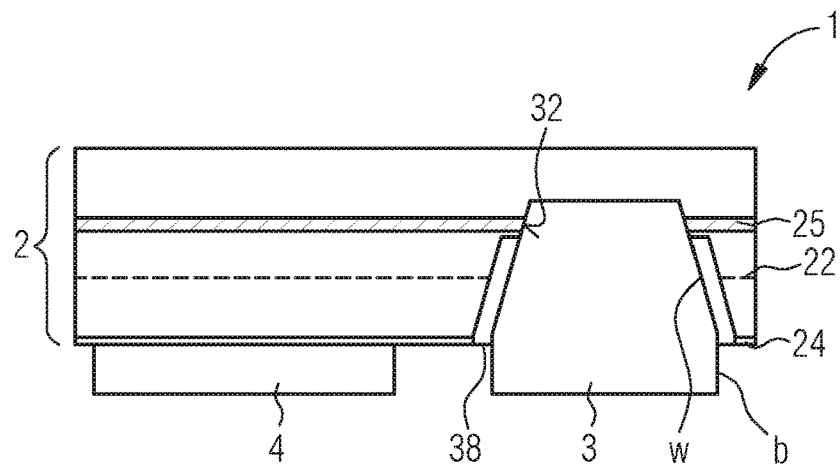

In the exemplary embodiment of FIG. 23, side walls of the via 3 are provided with the insulation layer 38, except on a bottom surface of the via 3 and except on the contact layer 25. Within the semiconductor layer sequence 2, the via 3 comprises the relatively small contact angle w throughout. Only outside the semiconductor layer sequence 2 the larger flank angle b is present.

Figure 24:
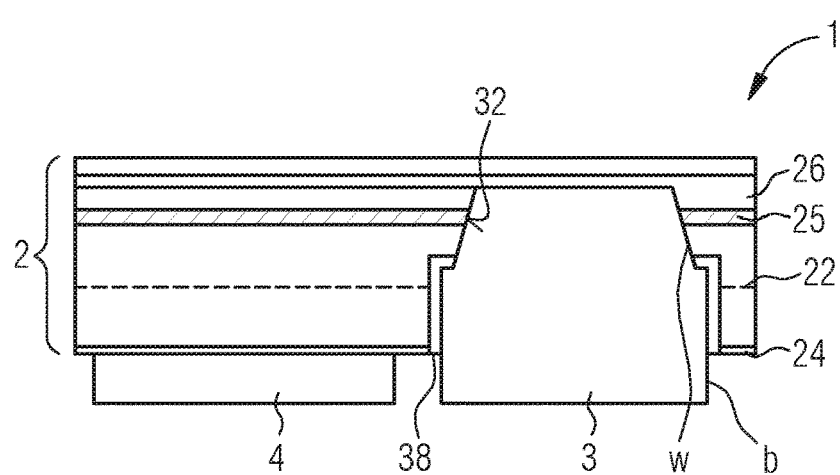

According to FIG. 24, the insulation layer 38 is present analogously to FIG. 23, wherein a region of the via 3 with the contact angle w is free of the insulation layer 38. The via 3 is designed as explained in connection with FIG. 21.

Deviating from the illustration in FIG. 24, the insulation layer 38 and the via 3 can also extend to the further contact layer 24. In this way, an area of the via 3 outside the semiconductor layer sequence 2 can be increased, whereby a larger area for cooling and mounting the semiconductor device 1 is also achievable.

Figure 25:
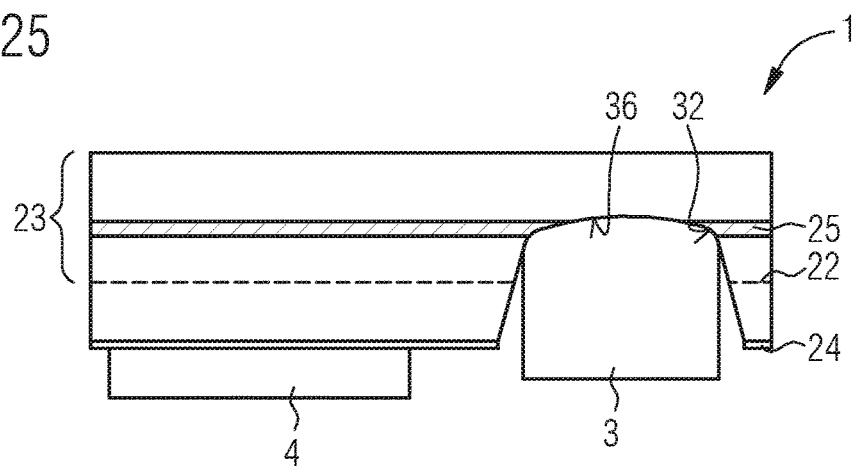

In FIG. 25, it is shown that the via 3 can comprise curved boundary surfaces in the area of the contact layer 25. That is, viewed in cross-section perpendicular to the active zone 22, the contact region 32 may appear as a bent curve, as may be the case for the interface 36. The same is true for all other exemplary embodiments.

Figure 26:
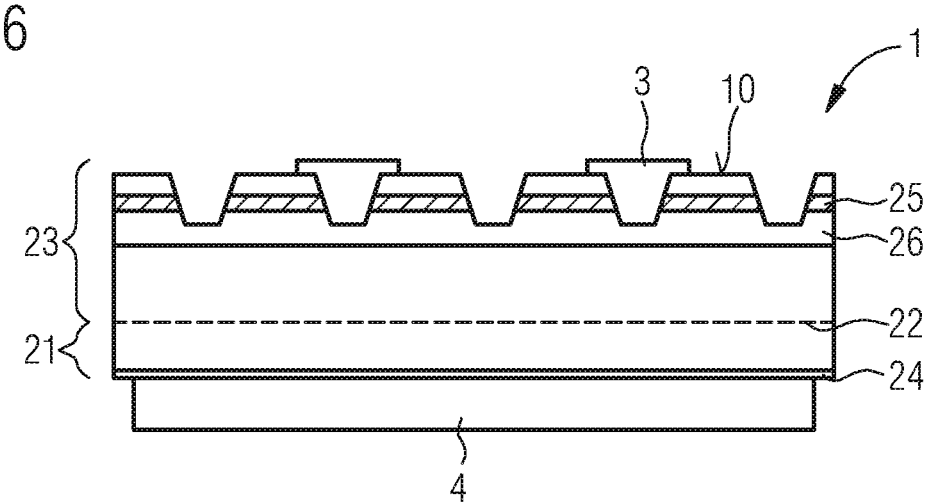

Unlike in the preceding exemplary embodiments, the via 3 according to FIG. 26 does not extend through the active zone 22, but is limited to a roughening of the second semiconductor region 23. The roughening penetrates the contact layer 25 in places, analogously to FIG. 8, so that the via 3 penetrates the contact layer 25.

Preferably, the via 3 extends only to a part of the radiation exit side 10 and thus only to a part of the contact layer 25. The roughening of the contact layer 25 may nevertheless extend over the entire semiconductor layer sequence 2. The roughening may be regular or irregular in shape.

Optionally, the semiconductor layer sequence 2 is not formed by the contact layer 25 at the radiation exit side 10, but by a further layer of the second semiconductor region 23. It is possible that the via 3 ends in the current spreading layer 26. The further contact 4 may cover a back side of the semiconductor layer sequence 2 over the entire surface or at least to 80% or 90%.

Unless otherwise indicated, the components shown in the figures preferably follow each other directly in the sequence indicated. Layers not touching in the figures are preferably spaced apart. Insofar as lines are drawn parallel to each other, the corresponding surfaces are preferably also aligned parallel to each other. Also, unless otherwise indicated, the relative positions of the drawn components to each other are correctly reproduced in the figures.

The invention described herein is not limited by the description based on the exemplary embodiments. Rather, the invention encompasses any new feature as well as any combination of features, which in particular includes any combination of features in the patent claims, even if that feature or combination itself is not explicitly specified in the patent claims or exemplary embodiments.

The invention claimed is:

1. An optoelectronic semiconductor device with a semiconductor layer sequence and with at least one electrical via, wherein
   the semiconductor layer sequence comprises an active zone for generating radiation and a contact layer for electrical contacting of the semiconductor layer sequence,
   the active zone lies in a plane (P) perpendicular to a main growth direction (G) of the semiconductor layer sequence and is located between a first semiconductor region with a first conductivity type and a second semiconductor region with a second conductivity type different from the first one
   the contact layer is located within the second semiconductor region,
   the via extends through the contact layer, and
   a contact region between the via and the contact layer includes a contact angle (w) to the plane (P) of at least 20° and of at most 70°.

2. The optoelectronic semiconductor device according to claim 1,
   wherein the contact angle (w) is between 20° and 50° inclusive,
   wherein the via extends through the first semiconductor region, through the active zone and through the contact layer and terminates within the second semiconductor region.

3. The optoelectronic semiconductor device according to claim 1,
   wherein the contact angle (w) is between 20° and 50° inclusive,
   wherein the via extends through the first semiconductor region, through the active zone and through the contact layer and through the second semiconductor region and terminates within a growth substrate located directly at the second semiconductor region.

4. The optoelectronic semiconductor device according to claim 1,
   wherein the contact angle (w) is between 20° and 50° inclusive, wherein the via is applied on the second semiconductor region and terminates within the second semiconductor region such that the first semiconductor region and the active zone are free of the via, and wherein the via is formed on a roughening of the second semiconductor region and the roughening completely penetrates the contact layer in places.

5. The optoelectronic semiconductor device according to claim 1, in which the semiconductor layer sequence is based on AlInGaP, wherein the via is metallic and contacts the second semiconductor region outside the contact region in an interface, wherein, in operation, a current feeding per unit area is lower at the interface than at the contact region by at least a factor of 10.

6. The optoelectronic semiconductor device according to claim 1, in which the via, as seen in plan view (P), is surrounded all around by a material of the semiconductor layer sequence, wherein the via pierces the contact layer by at most twice a thickness of the contact layer, wherein the thickness (T) of the contact layer is between 20 nm and 200 nm inclusive, and wherein the contact layer is made of AlGaInP doped with Si and/or with Te.

7. The optoelectronic semiconductor device according to claim 1, wherein the via is strip-shaped or L-shaped or U-shaped or frame-shaped as viewed in plan view (P), such that an aspect ratio of a longitudinal extension (L) and an average width of the via is at least five.

8. The optoelectronic semiconductor device according to claim 1, wherein a quotient of a mean width of the via and a thickness (T) of the contact layer is at least 3 and at most 25, wherein the average width is at most 1 µm.

9. The optoelectronic semiconductor device according to claim 1, wherein the contact region or at least a part of the contact region is configured as part of a cone shell.

10. The optoelectronic semiconductor device according to claim 1, wherein the contact region comprises a plurality of concentrically arranged annular or circular ring shaped parts as seen in plan view (P).

11. The optoelectronic semiconductor device according to claim 1, wherein the contact layer is pierced by the via a plurality of times, such that the contact region comprises a plurality of juxtaposed annular and/or island-shaped portions as viewed in plan view (P).

12. The optoelectronic semiconductor device according to claim 11, wherein the juxtaposed annular and/or island-shaped parts are arranged in a regular arrangement.

13. The optoelectronic semiconductor device according to claim 11, in which the juxtaposed annular and/or island-shaped parts are irregularly arranged so that the contact region is formed by a roughening which completely penetrates the contact layer in places.

14. The optoelectronic semiconductor device according to claim 1, in which the via is guided through the first semiconductor region and through the active region with a flank angle (b) of at least 70° to the plane (P), so that the smaller contact angle (w) is present only in the region of the contact layer and the flank angle (b) is greater than the contact angle (w) by at least 20°.

15. The optoelectronic semiconductor device according to claim 1, in which the contact layer extends over the entire second semiconductor region and is a continuous, closed layer except for the at least one via, wherein a thickness of the second semiconductor region at a side of the contact layer facing away from the active zone is continuously at least five times a thickness (T) of the contact layer wherein the second semiconductor region on the side facing away from the active zone is configured for lateral current distribution.

16. The optoelectronic semiconductor device according to claim 1, in which exactly one via is present, wherein the contact angle (w) is between 20° and 35° inclusive and the first semiconductor region is p-doped and the second semiconductor region is n-doped, and wherein a quotient of the contact region and an area of the via is between 6 and 1 inclusive, and an area of the active zone is at least 20 times larger than the contact region.

17. A method for producing an optoelectronic semiconductor device according to claim 1 comprising:

A) providing a growth substrate for the semiconductor layer sequence,

B) growing the semiconductor layer sequence on the growth substrate such that the second semiconductor region is closer to the growth substrate than the first semiconductor region, C) forming at least one recess for the at least one via through the contact layer, and D) forming the metallic via.

\* \* \* \* \*

UNITED STATES PATENT AND TRADEMARK OFFICE
CERTIFICATE OF CORRECTION

PATENT NO. : 11,955,588 B2
APPLICATION NO. : 17/298879
DATED : June 1, 2021
INVENTOR(S) : Korbinian Perzlmaier et al.

It is certified that error appears in the above-identified patent and that said Letters Patent is hereby corrected as shown below:

In the Claims

In Claim 1:
At Column 12, Line 35, delete "(P)".
At Column 12, Line 36, delete "(G)".
At Column 12, Line 45, delete "(w)" and "(P)".

In Claim 2:
At Column 12, Line 49, delete "(w)".

In Claim 3:
At Column 12, Line 57, delete "(w)".

In Claim 4:
At Column 12, Line 66, delete "(w)".

In Claim 6:
At Column 13, Line 20, delete "(P)".
At Column 13, Line 25, delete "(T)".

In Claim 7:
At Column 13, Line 32, delete "(P)".
At Column 13, Line 33, delete "(L)".

In Claim 8:
At Column 13, Line 38, delete "(T)".

In Claim 10:
At Column 13, Line 49, delete "(P)".

Signed and Sealed this
Twenty-first Day of May, 2024

Katherine Kelly Vidal
*Director of the United States Patent and Trademark Office*

In Claim 11:
At Column 14, Line 2, delete "(P)".

In Claim 14:
At Column 14, Line 16, delete "(b)" and "(P)".
At Column 14, Line 17, delete "(w)".
At Column 14, Line 18, delete "(b)".
At Column 14, Line 19, delete "(w)".

In Claim 15:
At Column 14, Line 27, delete "(T)".

In Claim 16:
At Column 14, Line 35, delete "(w)".